United States Patent [19]

Capasso et al.

[11] Patent Number: 4,849,799
[45] Date of Patent: Jul. 18, 1989

[54] RESONANT TUNNELING TRANSISTOR

[75] Inventors: Federico Capasso, Westfield, N.J.; Harry T. French, New York, N.Y.; Arthur C. Gossard, Warren; Albert L. Hutchinson, Piscataway, both of N.J.; Richard A. Kiehl, New York, N.Y.; Sustana Sen, Scotch Plains, N.J.

[73] Assignee: American Telephone and Telegraph Company AT&T Bell Laboratories, Murray Hill, N.J.

[21] Appl. No.: 897,378

[22] Filed: Aug. 18, 1986

Related U.S. Application Data

[63] Continuation-in-part of Ser. No. 892,245, Jul. 31, 1986, Continuation-in-part of Ser. No. 745,278, Jun. 14, 1985.

[51] Int. Cl.[4] .................. H01L 29/205; H01L 29/72
[52] U.S. Cl. ......................................... 357/34; 357/16; 357/4; 357/30; 307/474
[58] Field of Search .............. 357/45 L, 34, 30, 4; 307/474

[56] References Cited

U.S. PATENT DOCUMENTS

| | | | |
|---|---|---|---|
| 3,855,481 | 12/1974 | DeMone | 307/474 |
| 4,107,721 | 8/1978 | Miller | 357/30 |
| 4,695,857 | 9/1987 | Baba et al. | 357/16 |
| 4,712,121 | 12/1987 | Yokoyama | 357/16 |

FOREIGN PATENT DOCUMENTS

| | | | |
|---|---|---|---|
| 0068064 | 1/1983 | European Pat. Off. | 357/45 L |
| 0159273 | 10/1985 | European Pat. Off. | 357/45 L |
| 58-142574 | 8/1983 | Japan | 357/45 L |
| 59-67676 | 4/1984 | Japan | 357/45 L |

OTHER PUBLICATIONS

Dubon et al. "Double Heterojunction . . . Circuits", *IEDM* Wash. D.C. 1983, pp. 689–693.
Yokoyama et al. "A New Functional . . . (RHET)" *Jap. J. of Appl. Phys.* vol. 24, No. 11, Nov. 85, pp. 853–854.
Miller et al. "Parabolic System" *Physical Review B* vol. 29 No. 6. Mar. 15, 1984 pp. 3740–3743.
Woodland *Practical Electronics* London McGraw-Hill.

*Primary Examiner*—Andrew J. James
*Assistant Examiner*—Jerome Jackson, Jr.
*Attorney, Agent, or Firm*—Peter A. Businger

[57] ABSTRACT

A resonant-tunneling, heterostructure bipolar transistor having a quantum well between emitter contact and collector region is described. In one embodiment, a compositionally graded portion of the emitter region is adjacent to the base region, and there is a double barrier in the base region. In another embodiment the quantum well is defined by the emitter and a potential barrier in the base region. Further embodiments have a quantum well between emitter and collector regions or else within the emitter region.

21 Claims, 7 Drawing Sheets u = UNDOPED

| | EMITTER | | BASE | | | | | COLLECTOR |
|---|---|---|---|---|---|---|---|---|
| X | .25 | .24 ↑ .07 | .07 | 1 | 0 | 1 | 0 | 0 |
| DOPANT | n | n | p | u | u | u | u  p | n |

$B_1$  $B_2$ u = UNDOPED

| | EMITTER | | BASE | | | COLLECTOR |
|---|---|---|---|---|---|---|
| X | .25 | .25 ↑ 1.0 | 0 | 1 | 0 | 0 |
| DOPANT | n | n | p | u | p | n |

FIG. 18
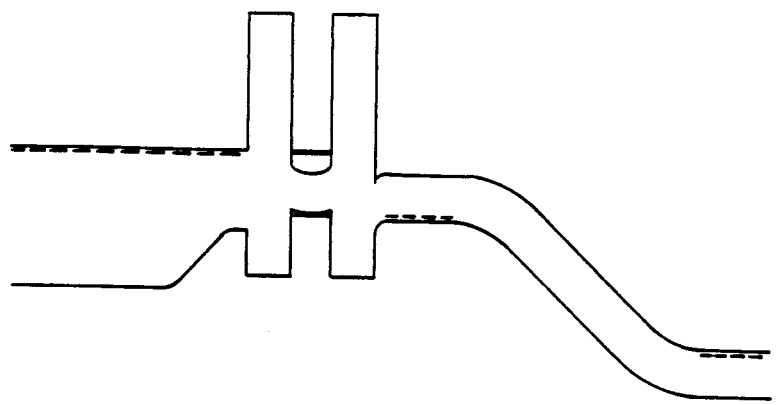
FIG. 19
| | EMITTER | | | I | | | BASE | COLLECTOR |
|---|---|---|---|---|---|---|---|---|
| X | .25 | .25↓.07 | .07 | 1 | 0 | 1 | 0 | 0 |
| DOPANT | n | n | n | u | u | u | p | n |
FIG. 20
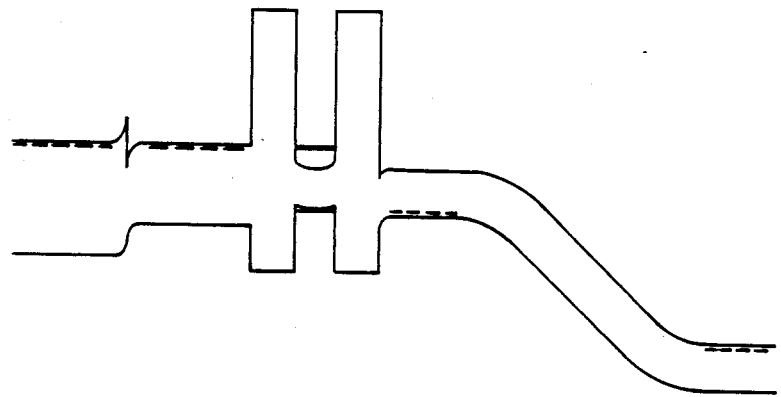

| | EMITTER | | I | | BASE | COLLECTOR |
|---|---|---|---|---|---|---|
| X | .25 | .07 | I 0 I | | 0 | 0 |
| DOPANT | n | n | u u u | | p | n |

| | EMITTER | I | | | BASE | COLLECTOR |
|---|---|---|---|---|---|---|
| X | .07 | I | 0 | I | 0 | 0 |
| DOPANT | n | u | u | u | p | n |

RESONANT TUNNELING TRANSISTOR

CROSS-REFERENCE TO RELATED APPLICATIONS

This is a Continuation-in-Part application of Patent Application Serial No. 892,245, filed July 31, 1986 by F. Capasso, H. T. French, A. C. Gossard, A. L. Hutchinson, R. A. Kiehl, and S. Sen, which is a Continuation-in-Part application of Patent Application Ser. No. 745,278, filed June 14, 1985 by F. Capasso, H. T. French, and R. A. Kiehl.

TECHNICAL FIELD

This invention relates generally to the field of transistors and particularly to such transistors which use resonant tunneling to obtain desired device operating characteristics.

BACKGROUND OF THE INVENTION

In the search for ever-faster solid state devices, many types of physical effects have been examined in the hopes that they would lead to faster devices or devices with more desirable characteristics. One of the more interesting physical phenomena so examined is particle tunneling through an energy barrier.

Perhaps the first such device using this effect was the "Tunnel Emission Amplifier," which was proposed by C. A. Mead in 1960. See, for example, Proceedings of the IRE, pp. 359-361, Mar. 1960. The proposed device had a metal-insulator-metal-insulator-metal structure with the current through the first metal-insulator-metal structure occurring primarily by tunneling. Another tunneling device was proposed by Kisaki in Proceedings of the IEEE, pp. 1053-1054, July 1973. The structure, which was termed a "tunnel transistor", had a metal-insulator-semiconductor structure with carriers tunneling from the metal emitter electrode through an insulator layer into the base. Tunneling in more complicated structures has also been studied. For example, the transport properties of carriers in a finite superlattice were also studied theoretically, with tunneling considered, in Applied Physics Letters, 22, pp. 562-564, June 1, 1973. Tunneling in this structure is of interest because of the possibility of obtaining negative differential conductivity.

Perhaps a still more interesting tunneling phenomenon is termed "resonant tunneling". Structures exhibiting resonant tunneling have two or more energy barrier layers surrounding one or more potential well layers. Resonant tunneling occurs when the carrier goes through an energy eigenstate of the well. Enhanced tunneling probabilities may be obtained as well as characteristics such as negative differential resistance. A resonant tunneling structure was studied by Chang, Esaki, and Tsu in Applied Physics Letters, 24 pp. 593-595, June 15, 1974, for the case of a double barrier. The resonance and current maxima occur when the applied voltages to the barrier layers are such that the Fermi energy at the electrodes is equal to that of one of the states in the potential well.

Earlier work by Davis et al, Journal of Applied Physics, 34 pp. 864-866, Apr., 1963, discussed a resonant tunneling triode having a metal-insulator-metal-insulator-metal structure. The device was a unipolar, majority carrier device and was similar to the device proposed by Mead in Journal of Applied Physics, 32, pp. 646-652, 1961.

A device termed the "tunnel triode" was proposed in Applied Physics Letters, 31,, pp. 687-689, Nov. 15, 1977. This article clearly points out one problem with may of the previously proposed tunnel devices, namely, that the region through which the carriers tunnel is an insulator, and it is therefore difficult to attach an electrode to that region. This, of course, makes three-terminal devices difficult to fabricate. The tunnel triode avoids this problem by using a structure having staggered heterojunctions with an energy bandgap structure such that carriers of one type tunnel through a barrier formed by the base region in which carriers of the other type are confined. The presence of the electrons in the base ensures that the base will be electrically conductive.

In spite of the effort expended, a review of the devices discussed shows that tunneling devices have not, in practice, lived up to their theoretical expectations. It has recently been realized that the physics of resonant tunneling contain physical effects which must be more carefully considered if device operation is to be optimized. To better understand these effects, it is useful to consider an analogy with a Fabry-Perot resonator. If the reflectivities of the mirrors in a Fabry-Perot resonator differ significantly from each other, the transmission through the cavity at the resonant frequencies decreases significantly below unity. An analogous situation arises in resonant tunneling through a double barrier with equal barrier heights and thicknesses when the application of an electric field produces a difference between the transmission coefficients of the two barriers. This breaks the intrinsic symmetry of the double barrier and can lead to an order of magnitude decrease in the tunneling current at resonance as the transmission probability for one barrier becomes significantly greater than the transmission probability for the other barrier. For example, the peak-to-valley ratio for a negative differential resistance device may be significantly less than expected. The effects are discussed in detail in, for example, Physical Review B, 29, pp. 1970-1981, Feb. 15, 1984.

This problem may be overcome by making one of the barriers thicker or higher than the other one. However, this is not a totally satisfactory solution, as the quality of the transmission coefficients and overall unity transmission is achieved for only one of the well resonances. The transmission for the remaining resonances continues to be significantly less than unity. For some applications, it is desirable that the total transmission be unity for several resonances.

SUMMARY OF THE INVENTION

We have found that resonant tunneling through a symmetric barrier may be achieved by high-energy minority carrier injection. One case is a bipolar transistor having at least one heterojunction, with the conduction and valence bands of the base region being below and above, respectively, the conduction and valence bands of the emitter region, and having at least one quantum well region in the base. The barriers forming the well are symmetric. The emitter and collector regions have a first conductivity type and the base region has a second conductivity type. The base-emitter and base-collector junctions are forward and reverse biased, respectively. As the base-emitter voltage increases from zero, a point is eventually reached at which the Fermi level in the emitter and first resonant state in the quantum well are matched. Electrons tunneling from the emitter are injected into the first state of the well, and resonant tunneling through the symmetric barrier occurs with near unity transmission probability. Off the resonance, the transmission probabilities are typically much less than unity, and the transmission probability through the device is equal to the product of the transmission coefficients of the two barriers without the quantum well.

In one embodiment, the emitter is degenerately doped. In another embodiment, an abrupt emitter is used, and electrons are ballistically launched into the quantum states of the well. The symmetric barrier may be a double barrier having a square or parabolic quantum well. The transistor may be multiple resonances when the barrier parameters are appropriately selected and is of utility for a variety of both signal processing and logic applications. For example, some applications utilize the multiple-value voltage transfer characteristic. Other applications use the multiple-value negative resistance characteristic.

Other embodiments of the invention do not involve high-energy injection of minority carriers. In one case of resonant tunneling transistor operation, a bipolar structure comprises a wide-bandgap graded emitter and a double barrier in the base region; in another, such structure comprises an emitter with abrupt narrowing of the bandgap, and a potential barrier in the base region. In all cases contemplated so far, a heterostructure bipolar device has, in its base region, a composition and bandgap profile such that the base region has a quantum well. Also, the emitter and base regions form a junction such that, for at least some operating condition of the device, a conduction electron energy state of the quantum well is at or below the conduction band of the emitter region, and such that the highest valence band state of the base region is above the valence band of the emitter region.

In yet another embodiment of a resonant-tunneling, heterostructure bipolar transistor, a quantum well is still between emitter and collector regions, but not, as contemplated above, in the base region; rather, in this embodiment of the invention, a quantum well is a region intermediary to emitter and base regions. And, finally, the quantum well may be doped like the emitter, the quantum well thus being located in the emitter region.

Device operation can be characterized in terms of first, second, and third base-emitter voltages at which the bottom of the conduction band in at least a portion of the emitter region is below at, and above, respectively, a quantum resonance of the quantum well.

BRIEF DESCRIPTION OF THE DRAWING

FIG. 18 is an energy band diagram of a device under operating conditions in which a quantum well is in a region between emitter and base regions;

FIG. 19 is a graphical representation of the compositional make-up of a specific device of the invention in correspondence with FIG. 18;

FIG. 20 is an energy band diagram of a alternate device under operating conditions in which a quantum well is in a region between emitter and base regions;

DETAILED DESCRIPTION

For reasons of clarity, the elements of the device are not drawn to scale in the several Figures.

Figure 1:
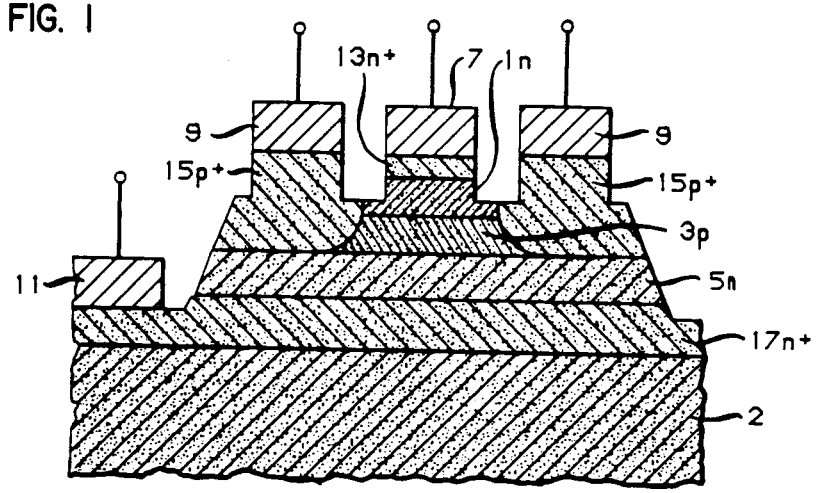
FIG. 1 is a sectional view of a transistor according to this invention.

The device of FIG. 1 comprises emitter region 1, base region 3, and collector region 5. There are electrical contacts 7, 9, and 11 to the emitter, base, and collector regions, respectively. The quality of these contacts is increased by use of heavily doped regions 13, 15 and 17, which contact the emitter, base and collector, respectively. All layers are grown on substrate 2. The emitter and collector have a first conductivity type, and the base has a second conductivity type. The base-emitter and base-collector junctions are, respectively, forward- and reverse-biased when the device is operating. The device is a heterojunction structure with the emitter having a wider bandgap than has the portion of base region adjacent to the emitter. The heterojunction is type I; i.e., the conduction and valence bands of the narrow bandgap region are below and above, respectively, those of the wide bandgap region.

In one embodiment, the emitter is degenerately doped, i.e., the Fermi level is in the conduction band. The base region comprises at least one potential quantum well which may be formed by, for example, a symmetric double barrier in the base region, although other embodiments are contemplated and will be discussed. A quantum well is a potential well having discrete energy eigenstates, i.e., the allowed energy levels do not form a continuum.

In one specific embodiment, the emitter comprises $Al_xGa_{1-x}As$ with $x \leq 0.4$. The dopant concentration is greater than $10^{17}/cm^3$. The first and second conductivity types are n- and p-type, respectively. The double barrier, which is desirably in the center of the base region, has a GaAs well layer and $Al_xGa_{1-x}As$ rectangular barrier layers having equal thicknesses on opposite sides of the well. The well layer typically has a thickness between 30 and 60 Angstroms, and the barrier layers typically have thickness between 15 and 50 Angstroms. The compositions and doping concentrations ensure that there is adequate hole confinement in the base region as well as high-injection efficiency. The barrier and well layers should preferably be undoped or nominally undoped to minimize both scattering and recombination. These are important considerations since high transmission depends upon maintaining wage function coherence. Alloy disorder in the barrier layers may contribute to scattering of the injection electrons. However, this can be minimized by the use of AlAs barriers for the embodiment just described.

The base layer outside the barrier region is heavily doped and should have a thickness which will provide the required low base resistance. Typical doping concentrations in these regions are within the range from $10^{18}/cm^3$ to $5 \times 10^{18}/cm^3$ and typical thicknesses are between 800 and 1000 Angstroms. More generally, the base region should have a thickness between the barrier region and the emitter which is smaller than the scattering mean-free path of the electron injection from the emitter but greater than the zero bias depletion width on the p-side. A preferred range is between 500 and 1000 Angstroms which also has the effect of minimizing quantum size effects.

The devices are conveniently fabricated using well-known epitaxial growth techniques, e.g., molecular beam epitaxy or metallo-organic chemical vapor deposition, hat are capable of growing layers of the desired thickness. After growth of the layers has been completed, conventional lithographic and metallization schemes are used to form the contacts, etc., layers 13 and 17 are expediently doped during epitaxial growth while region 15 is easily doped by masking and diffusion. The device depicted has an annular contact 9 to the base region. Exemplary device fabrication is as described by R. J. Malik et al., "High-gain, High-frequency AlGaAs/GaAs Bank-gap Base bipolar Transistors with a Be Diffusion Setback Layer in the Base", Applied Physics Letters, 46, pp. 600–603 (1985).

To achieve high current at resonance, the width of the resonant peak should be approximately equal to the width of the energy distribution of the electrons in the emitter.

If it is desired that there be several peaks in the collector current versus emitter-base voltage characteristic curve, then the well should be relatively thick and the barriers should be high, i.e., if the AlGaAs system is used, the barriers should have a high Al concentration. A narrow well with low barriers may have only a single state, a multiple peaks in the characteristic curve will not be obtained. A desirable well thickness is typically between 100 and 200 Angstroms.

Figure 2:
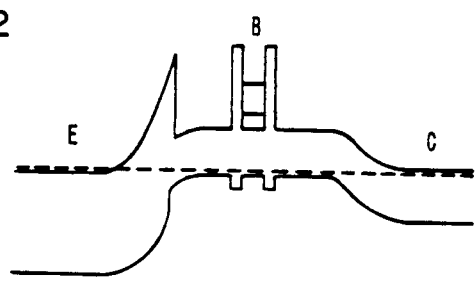
FIGS. 2-7 are the energy band diagrams for several embodiments of this invention.
Figure 3:
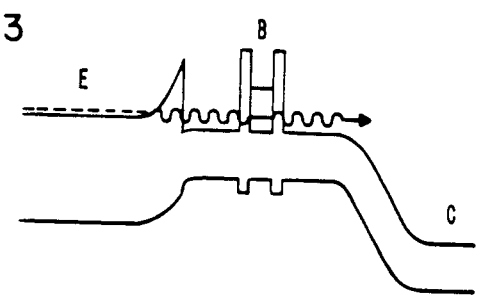
Figure 4:
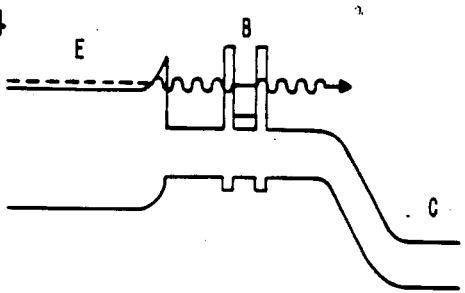

Device operation will be better understood from the following considerations. FIG. 2 is the energy band diagram for a transistor according to this invention with a tunneling emitter under equilibrium conditions. In FIGS. 2-7, the emitter, based and collector regions are indicated as E, B and C, respectively. The potential well is formed by a double-barrier in the base region. The Fermi level in the emitter is below the level of the first resonant state in the barrier region. For reasons of clarity, only two resonant states are shown. More will typically be present. As the base-emitter voltage increases, the energy difference between the Fermi level in the emitter and the first resonant state of the quantum well decreases. When the two levels are equal, the electrons tunneling from the emitter region are injected into the first state of the well and undergo resonant tunneling through the double barrier with near unity transmission probability. Off resonance, the transmission probability is much less than one and is equal to the product of the transmission coefficients of the two barriers without the quantum well. In FIGS. 3 and 4, the base-emitter voltage has been adjusted so that resonant tunneling occurs through the first and second resonant states, respectively. The collector current as a function of the base-emitter voltage exhibits a series of peaks which correspond to the various quasi-stationary states of the well. Thus, a multiple negative conductance characteristic in the collector circuit can be obtained.

It should be noted that the transmission coefficients of the two barriers need not be unity. They need only be equal. Coefficients much less than one will require a longer time for the probability density to build up, and more charge will be required.

Figure 5:
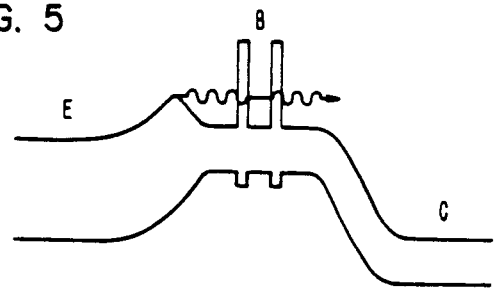

An alternative embodiment uses a nearly abrupt emitter to ballistically launch electrons into the resonant states with high-momentum coherence. As the base-emitter voltages increase, the top of the launching ramp eventually reaches the same energy as that of the resonant state so that electrons are ballistically launched into the resonant state. The energy band diagram for this embodiment is depicted in FIG. 5.

Figure 6:
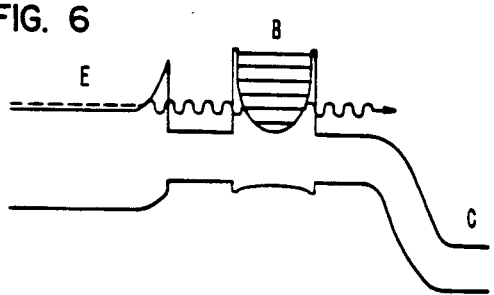

As is well known, a square well does not have equally spaced energy levels, and the resonances are not equally spaced. However, if equally spaced peaks are desired in the collector current, the rectangular quantum well in the base previously described may be replaced by a parabolic-shaped well, as shown in FIG. 6. Parabolic quantum wells may be expediently realized in the AlGaAs material system, as well as other systems, by techniques well known to those skilled in the art. See, for example, R. C. Miller, A. C. Gossard, D. A. Kleinman and O. Munteanu, Physical Review B, 29, pp. 3740–3743, 1984. The energy levels in a parabolic well have approximately equal spacing. If it is assumed that the depth of the parabolic well is approximately 0.43 eV and its width is 400 Angstroms, then one finds the first state is at an energy of 11 meV from the bottom of the well and that the resonant states are separated by approximately 33.4 meV. As a result, there are twelve states in the well.

Figure 7:
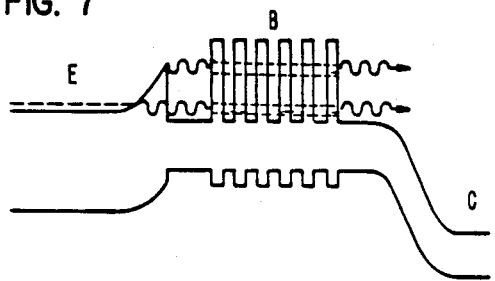

A superlattice having a plurality of potential wells may be used in the region, as depicted in FIG. 7, to use ballistic launching for high-energy transport in the minibands of the superlattice. The minibands are formed when the barriers are sufficiently thin that the quasi-eigenstates of the wells are strongly coupled.

Other embodiments are contemplated. For example, the base region may form the well. That is, the edges of the well are formed by two heterojunctions. The doping concentration in the collector should be less than that in the emitter so that the collector barrier is less transmitting at zero bias, i.e., equilibrium than is the emitter barrier. Equality of transmission is obtained when $V_{BE}$ and $V_{BC}$ are applied. However, equality of transmission through the barriers is obtained for only a single resonance. Both the emitter and collector are degenerately doped except for the portions near the base which have intrinsic conductivity.

A precise explanation of device operation also requires that the time dependence of the resonant tunneling be considered. To achieve resonant tunneling, the electron probability density must peak in the well. Therefore, if there are initially no electrons between the double barriers and the carriers are made to tunnel by applying a positive base-emitter voltage, a certain time must elapse before the desired probability density builds up in the well, via multiple reflections, and the required high transmission and resonances are obtained. An analogous situation occurs in an optical Fabry-Perot cavity. The required time constant is approximately $h/\Delta E$ where $\Delta E$ is the width of the resonant state. It is noted that the time constant increases exponentially with barrier thickness. After several time constants have elapsed, an essentially steady state has been reached in which electrons continuously enter the well and exit from it to maintain a constant electron density in the well. The traversal time of an electron through the barriers is significantly shorter than the time constant for the range of thicknesses in barrier heights discussed. The intrinsic short time constants of this device make it, of course, of interest in ultra-high-speed signal processing and logic applications.

Other interesting materials combinations for the heterojunction device are AlInAs/GaInAs because of the large conduction band discontinuity and the low electron effective mass in GaInAs. Other Group III–V and II–VI compound semiconductors may be used.

Figure 8:
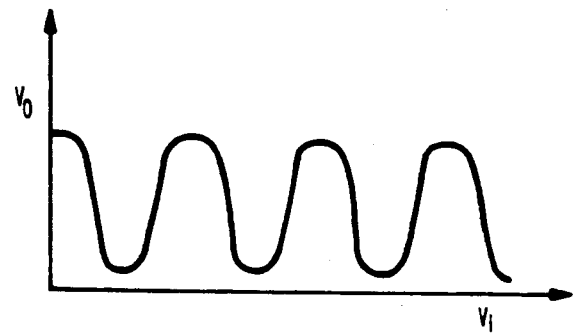
FIG. 8 plots the multiple-value transfer characteristic of a device according to this invention.
Figure 9:
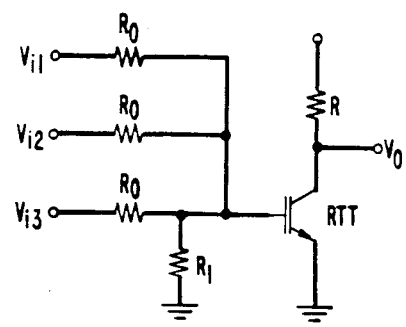
FIG. 9 is a parity generator circuit according to this invention.

Multiple resonant characteristics make the device of interest for many applications. A multiple valued voltage transfer characteristic is shown in FIG. 8 with the input voltage plotted horizontally and the output voltage plotted vertically. Arbitrary units are used for both axes. The output voltage takes on one of two values in accordance with the level of the input voltage. The device, accordingly, provides a binary digital output for an analog input or a multiple value digital input. This function is that of a threshold logic gate and is useful in a variety of signal processing applications. For example, one device of this type may be used to provide a parity generator as used in error detection circuits such as the circuits shown in FIG. 9. The resonant tunning transistor is shown as RTT and the base is indicated with a double line. For this application, the binary bits, for example, $V_{i1}$, $V_{i2}$ and $V_{i3}$ of a digital word are added in a resistive network, i.e., resistances $R_0$, at the input, as depicted. Resistance $R_1$ is connected to ground and Resistance R is connected to the collector. The output voltage is shown as $V_0$. This circuit produces a binary output having a value that depends upon whether the total number of ones in the input word is odd or even. This approach is advantageously used because its implementation uses only a single device.

Figure 10:
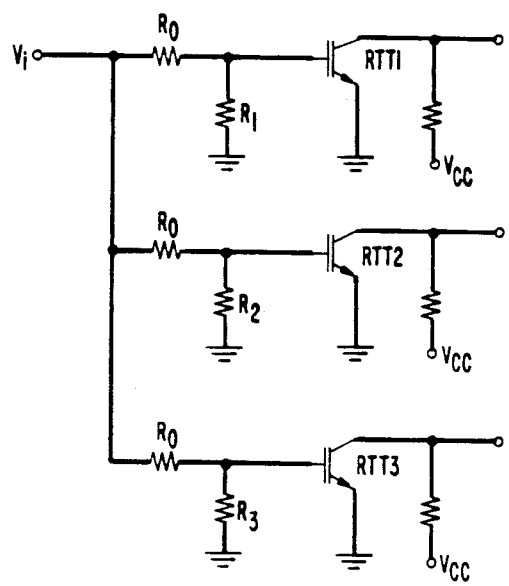
FIG. 10 is a circuit diagram of an analog-to-digital converter according to this invention.

A number of the devices according to this invention may be combined in a parallel array, as depicted in FIG. 10, to form an analog-to-digital converter. For this application, the analog input $V_i$ is simultaneously applied to parallel array of resonant tunneling transistors through a plurality of voltage scaling networks, namely, $R_0$ and $R_1$, $R_0$ and $R_2$ and $R_0$ and $R_3$ to RTT1, RTT2 and RTT3, respectively. Thus, an interlaced pattern of harmonically related transfer characteristics is produced. The outputs of the array constitute a binary code which represents the quantized analog input level.

Figure 11:
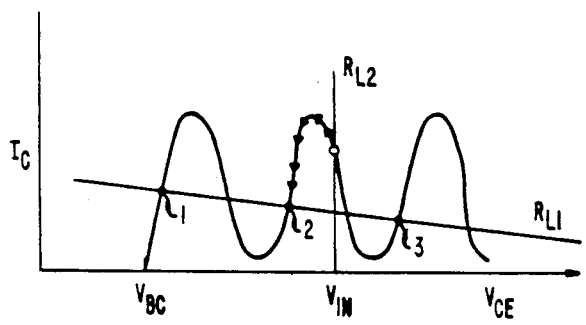
FIG. 11 plots the current-voltage characteristic for a device according to this invention.
Figure 12:
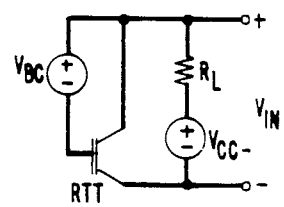
FIG. 12 is a circuit diagram of a device having a plurality of stable states.

A multiple valued negative resistance characteristic may be obtained as shown in FIG. 11. This type of characteristic may be obtained at the emitter-collector terminals if the base-collector junction voltage is maintained at a fixed bias, i.e., the circuit comprises means for maintaining the junction at a fixed bias. Such means are well known in the art. With the bias fixed, variations in $V_{EB}$ causes the collector current to peak as a tunneling resonance is crossed. When connected to a resistive load, a device having N stable states is produced where N is the number of resonant peaks. One suitable circuit is depicted in FIG. 12. The state may be set by momentarily applying a voltage to the circuit, forcing the operating point to that of one of the open circuits. When the input line is open, the operating point moves along the indicated trajectory and finally latches at state 2. Thus, the device can serve as an N state memory element, thereby providing the possibility of higher density data storage than is possible with two state devices.

Other embodiments are contemplated and will be readily thought of by those skilled in the art. For example, a p-n-p transistor could also be constructed in which case holes, rather than electrons, undergo tunneling.

Additionally, the emitter and collector regions near the base may be doped with acceptors. If the base is now a quantum well, as previously described, a two-dimensional hole gas is formed in the base. Furthermore, the transistor may be operated as a phototransistor with a floating base. The result is an optical switch with a collector current that is very strongly peaked as a function of light intensity.

It has been found that resonant-tunneling transistor operation can be achieved also in devices involving low-energy injection of minority carriers and, more specifically, involving thermal injection and transport of such carriers through the base. One such embodiment is a heterojunction bipolar structure comprising a wide-bandgap graded emitter and a double barrier in the base region. Thermal injection is achieved by adjusting the alloy composition of the base in the regional adjacent to the emitter, resulting in at least approximate lining-up of the conduction band in such region with the bottom of the ground-state subband of the quantum well (In actual manufacture, slight mismatch or misalignment is to be expected in this respect, in which case it is preferable for the conduction band to be slightly below the bottom of the ground-state stubband of the quantum well. Preferably, this mismatch amounts to not more than a few kT and, specifically, not more than 5 kT thermal energy. (At room temperature, T near 300 degrees K, kT is approximately 26 meV.) Under certain conditions, up to 10 kT may be tolerated.

Figure 13:
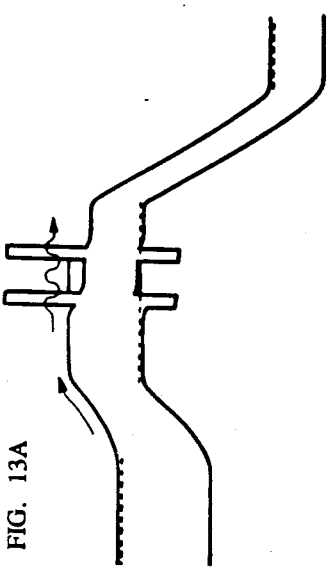
FIG. 13A, 13B, and 13C are energy band diagrams corresponding to three different operational states of a further embodiment of the invention.
Figure 13:
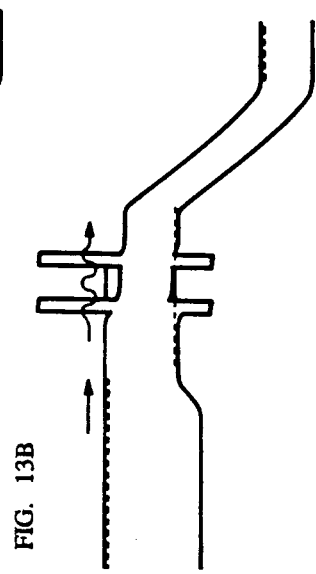
Figure 13:
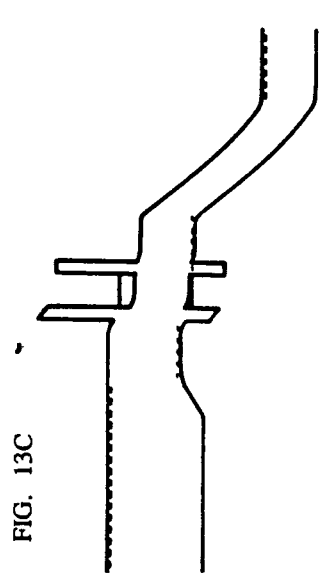
Figures 15, 16, 17:
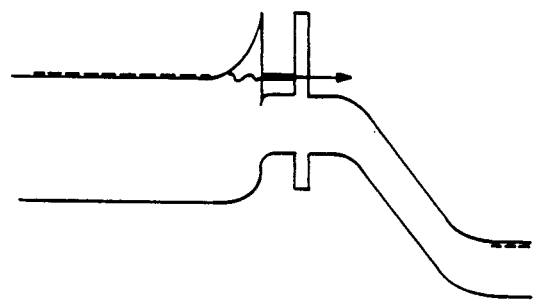
FIG. 15 is a graphical representation of the compositional make-up of a specific device of the invention, such representation being in correspondence with energy band diagrams as shown in FIG. 13A, 13B, and 13C.
FIG. 16 is an energy band diagram of a device under operating conditions in which the emitter serves to define one side of the quantum well in accordance with a further embodiment of the invention.
FIG. 17 is graphical representation of the compositional make-up of a specific device of the invention in correspondence with FIG. 16.

Device operation may be appreciated with reference to FIG. 13A, 13B, and 13C; and 14A, 14B, and 14C; these figures apply to an AlGaAs device and, in particular, to a device whose compositional structure in terms of the formula $Al_xGa_{1-x}As$ is as schematically represented in FIG. 15, and whose manufacture is described below in Example 1.

Figure 14:
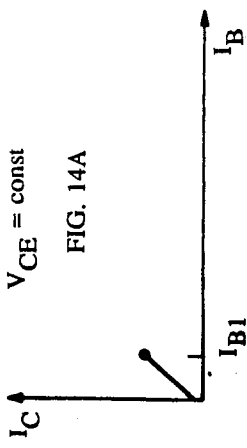
FIG. 14A, 14B, and 14C are diagrams illustrating a functional relationship between collector current and base current in respective correspondence with FIG. 13A, 13B, and 13C.
Figure 14:
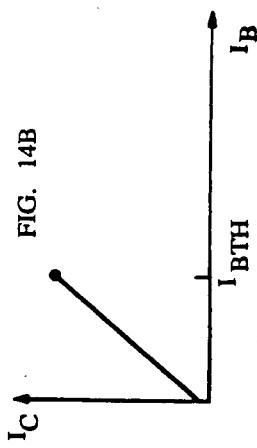
Figure 14:
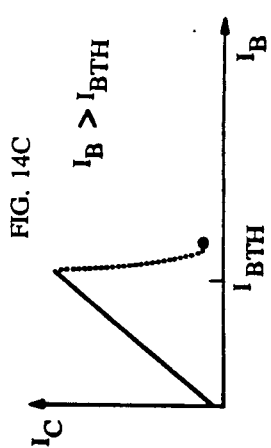

Initially, the collector-emitter voltage, $V_{CE}$, and the base current, $I_B$, are chosen such that the base-emitter junction is forward-biased, and the base-collector junction is reverse-biased. If $V_{CE}$ is kept constant, and the base current $I_B$ is increased, the base-emitter potential also increases until flat-band condition in the emitter region is reached (see FIG. 13A). In going from the band configuration of FIG. 13A to that of FIG. 13B, the device behaves like a conventional transistor with the collector current linearly increasing with the base current (see FIG. 14A). The slope of this curve is the current gain $\beta$ of the device. In this region of operation, electrons in the emitter overcome, by thermionic injection, the barrier of the base-emitter junction and undergo resonant tunneling through the double barrier. If now the base current is further increased above the value $I_{BTH}$ corresponding to the flat-band condition, the additional potential difference drops primarily across the first potential barrier (see FIG. 13C) between a contact portion $B_2$ and an uncontacted portion $B_1$ of the base because the highly doped emitter is now fully conducting. This pushes the conduction band edge of the aluminum gallium arsenide above the first energy level of the well, thus quenching the resonant tunneling. The net effect is that the base transport factor and the current gain are greatly reduced. This causes an abrupt drop of the collector current as the base current exceeds a certain threshold value $I_{BTH}$ (see FIG. 18). This is an important manifestation of the inherent negative transconductance and negative differential resistance of this device. (Depending on operating point, all devices of the invention are capable of exhibiting negative transconductance and negative differential resistance. Operating point depends on a number of parameters such as, e.g., the resistance between the collector and the voltage source and on the specific amount of the base current.)

As illustrated by FIG. 15, the quantum well is undoped; alternatively, a doped quantum well may be advantageous in the interest of facilitating electrical contact. In the interest of minimized scattering, the barriers defining the quantum well are undoped. Adjoining offset regions are optional, and they may be doped or undoped. No contact is made to region $B_1$ of the base.

Alternatively, region $B_1$ may be omitted altogether as, e.g., in the case of an abrupt emitter as illustrated by the band diagram shown in FIG. 16 and corresponding compositional diagram shown in FIG. 17 relating to $Al_xGa_{1-x}As$ material. This represents a variant of the invention in which the emitter serves to define one side of the quantum well in lieu of one of the potential barriers. In this case, under operating conditions, the emitter preferably is degenerately doped, and thermal injection is achieved by forward-biasing.

In all cases, the quantum well may have a non-rectangular profile and, in particular, a parabolic profile. Also, a multiplicity of quantum wells can be used as produced by a superlattice in the base region.

With respect to material systems, preferred devices of the invention can be made either on GaAs or on InP substrates as follows:

In the case of GaAs, the collector is made of GaAs or AlGaAs, the latter being preferred in the case of double heterostructure. Barriers are preferably made of $Al_xGa_{1-x}As$, with $0.2 \leq x \leq 1$, and the quantum well of GaAs which preferably is binary or essentially binary, but with AlGaAs not precluded. The non-contacted part of the base is preferably made of $Al_yGa_{1-y}As$ with $y \leq x$, the upgraded part of the emitter of $Al_zGa_{1-z}As$, with $0.05 < z \leq 1$, and the graded part preferably linearly graded between the non-contacted part of the base and the upgraded part of the emitter.

In the case of an InP substrate there are two preferred major choices depending on barrier material; these are discussed in the following paragraphs (i) and (ii), respectively.

(i) The collector can be made of InP or else of $Ga_{0.47}In_{0.53}As$, the former being preferred in the case of double heterostructure. Barriers are made of InP, and the quantum well of $Ga_{0.47}In_{0.53}As$, lattice matched to InP. For the quantum well, quaternary compounds can also be used. The non-contacted part of the base is made of InGaAsP, lattice-matched to InP. The ungraded part of the emitter is made of InP, and the graded part of InGaAsP.

(ii) The collector can be made either of $Ga_{0.47}In_{0.53}As$, or of $Al_{0.48}In_{0.52}As$, or else of InP, the latter two being preferred in the case of double heterostructure. Barriers are made of $Al_{0.48}In_{0.52}As$, lattice-matched to InP, and the quantum well of $Ga_{0.47}In_{0.53}As$, lattice matched to InP. The non-contact part of the base is made of AlInGaAs, lattice-matched to InP. The ungraded part of the emitter is made of $Al_{0.48}In_{0.52}As$, and the graded part of AlInGaAs.

Among techniques suitable for the deposition of layers in structures in accordance with the invention are the following: molecular beam epitaxy (MBE), metalorganic chemical vapor deposition (MOCVD), vapor phase epitaxy, levitation epitaxy, and pulsed-beam molecular beam epitaxy; with respect to the latter, see e.g., M. Kawabe et al., "Composition Control of $Al_xGa_{1-x}As$ and New Type of Superlattice by Pulsed Molecular Beam", Japanese Journal of Applied Physics, Vol. 21 (1982), pp. L447–L448; and R. C. Miller et al., "Parabolic Quantum Wells with the GaAs - $Al_xGa_{1-x}As$ System", Physical Review B, Vol. 29 (1984), pp. 3740–3743.

It has been realized further that resonant-tunneling, heterostructure bipolar transistor operation can be produced in cases in which a quantum well is in between base and emitter regions, and also in cases where such quantum well is actually within the emitter region, the latter case being realized by n-doping the quantum well. Specific preferred embodiments of the case in which the quantum well is between base and emitter regions are illustrated by energy band diagrams presented as FIG. 18, 20, and 22 in combination with corresponding compositional diagrams presented as FIG. 19, 21, and 23.

As in FIG. 17, "u" stands for "undoped" in the sense that there is no intentional dopant addition during layer deposition. While barrier layers are preferably undoped, doping combinations as shown in Table 1 are not precluded. And, even in the preferred case of an undoped well, there will be, at room temperature, a density of holes in the well which have tunneled through the p-doped base. (In Table 1, $B_1$ denotes the barrier region first encountered by injected carriers, W denotes the quantum well region, and $B_2$ denotes the second barrier region.) Energy band diagrams of FIG. 18, 20, and 22, as those of FIG. 2–7, 13B, and 16 apply to maximum-collector-current conditions.

The following Examples illustrate device manufacture and device performance, room-temperature operation as reported in Example 1 being an especially desirable feature of this embodiment of the invention.

EXAMPLE 1

A device was made by molecular beam epitaxy (MBE) deposition on a GaAs substrate doped n+ with Si. A 2100-Angstrom GaAs buffer layer, ndoped with Si to $3\times10^{17}/cm^3$ carrier concentration was deposited, followed by a 1.6-micrometer collector layer of GaAs, n-doped with Si to approximately $10^{16}/cm^3$ carrier concentration. The base layer starts with a 1900-Angstrom GaAs region adjacent to the collector, and p+-doped with Be to approximately $10^{18}/cm^3$ carrier concentration; followed by a 210-Angstrom setback layer of undoped GaAs. A double barrier was then grown consisting of a 74-Angstrom undoped GaAs quantum well sandwiched between two undoped 22-Angstrom AlAs barriers. The last portion of the base was a 530-Angstrom layer of $Al_{0.07}Ga_{0.93}As$, 105 Angstrom adjacent to the double barrier being undoped and the remainder p-doped with Be to approximately $10^{18}/cm^3$ carrier concentration. The two setback layers serve to offset Be diffusion into the double barrier during high-temperature growth at approximately 680° C. of the AlGaAs graded emitter. The latter was made as a 530-Angstrom layer of $Al_xGa_{1-x}As$, linearly graded from $x=0.07$ to $x=0.24$ adjacent to the base and doped n+ with Si to approximately $3\times10^{17}/cm^3$ carrier concentration; and of a 3200-Angstrom layer of $Al_{0.25}Ga_{0.75}As$, doped n+ with Si to approximately $3\times10^{17}/cm^3$ carrier concentration. Finally, a 1000-Angstrom contact layer was deposited, doped n+ with Si to approximately $3\times10^{18}/cm^3$ carrier concentration, separate from the emitter by a 530-Angstrom region, doped n+ with Si to approximately $3\times10^{18}/cm^3$ carrier concentration and linearly graded from $x=0.24$ to $x=0$.

Samples having an emitter area of approximately $7.5\times10^{-5}$ $cm^2$ were made using photolithographic and wet etching techniques. The base layer was revealed by anodic etching in $H_3PO_4/H_2O$. The portion of the base ($Al_{0.07}Ga_{0.93}As$) adjacent to the emitter was also etched away. The remainder of the base was provided with a contact of AuBe (400 Angstroms) on Au (1100 Angstroms), alloyed at approximately 400° C. in a hydrogen flow for 2 seconds. For the n-type contact to the emitter and the collector, Au (500 Angstroms) on Sn (250 Angstroms) on Au (2000 Angstroms) was used, alloyed at approximately 450° C. for 1 second.

The barrier structure of this sample device is such that the first quantized energy level is $E_1=65$ meV, and $\Delta E_C$ is approximately equal to $E_1$. Approximate equality is understood in the sense that $E_1$ does not exceed $\Delta E_C$ by more than a few kT. The use of aluminum arsenide for the barriers is in the interest of minimizing thermionic currents. The quantum well region was left undoped; nevertheless, there is a high concentration (approximately $7\times10^{11}/cm^2$) of two-dimensional hole gas in the well. Such holes have transferred from the nearby aluminum gallium arsenide region by tunneling through the aluminum arsenide barrier, so as to achieve Fermi level line-up in the base.

The device was tested at a temperature of approximately 300 degrees K., and the current-voltage characteristics were displayed on a tracer. For base currents $I_B$ less than or equal to 2.5 mA, the transistor exhibited normal characteristics, while for $I_B$ greater than or equal to 2.5 mA the behavior was as discussed above. Collector current increases in direct relationship with base current and there is current gain ($\beta=7$ for $I_C>4$ mA). As the base current exceeds 2.5 mA there is a drop in $I_C$ due to quenching of the current gain mechanism by the suppression of resonant tunneling. The transistor characteristics were also measured in a pulsed mode using 300 microsecond pulses. A behavior identical to that of FIG. 14C was observed, which shows that heating effects do not play a significant role.

The device exhibited similar behavior at other temperatures in the range of from 100 degrees K. to 300 degrees K.; the negative transconductance being greater at lower temperatures. This is attributed to more rapid quenching of resonant tunneling at lower temperatures.

When biased in the negative conductance region of the characteristic, the device acted as an oscillator. The current oscillation in the collector circuit was picked up by a loop and displayed. The operating point was $V_{CE}=12$ V, $I_B=6$ mA. Oscillation was observed having high spectral purity, particularly at low temperature.

By changing the bias conditions ($I_B$, $V_{CE}$), the oscillation frequency could be tuned over a range of several megahertz. At room temperature the device ceases to oscillate for base currents less than approximately 2.5 mA because, at such currents, device operation is outside of the negative conductance region where resonant tunneling is not quenched; see FIG. 14C.

EXAMPLE 2

A structure as follows represents an embodiment of the invention in accordance with FIG. 18 and 19:

A GaAs substrate (semi-insulating or doped n+ with Si) with a 2000-Angstrom GaAs buffer layer, n-doped with Si to approximately $3\times10^{17}/cm^3$ carrier concentration;

a 1.5-micrometer GaAs collector layer, n-doped with Si to approximately $5\times10^{16}/cm^3$ carrier concentration (such thick, weakly doped layer is conveniently made, e.g., by depositing 300 periods alternating between 1.7-Angstrom GaAs, n-doped with Si to approximately $3\times10^{17}/cm^3$ carrier concentration, and 48.3-Angstrom undoped GaAs);

a 3000-Angstrom GaAs based layer, p-doped with Be to a carrier concentration in a preferred range from $10^{18}$ to $5\times10^{18}/cm^3$, optionally followed by an undoped GaAs offset layer which typically has a thickness in range from 20 to 1000 Angstroms;

an undoped AlAs first barrier layer which typically has a thickness in a range from 20 to 100 Angstroms;

an undoped GaAs quantum well layer having a thickness in a preferred range from 30 to 300 Angstroms;

an undoped AlAs second barrier layer which typically has a thickness in a range from 20 to 100 Angstroms, optionally followed by an undoped $Al_xGa_{1-x}As$ offset layer typically having a thickness in a range from 20 to 1000 Angstroms, where choice of composition, x, is motivated by the condition that the first quantum state, $E_1$, be equal to or exceed the conduction band discontinuity between the material of the well and the material adjacent to the barrier first encountered by injected carriers, $\Delta E_C$, by at most a few kT;

a 500-Angstrom $Al_xGa_{1-x}As$ emitter graded layer, with x gradually changing across the thickness of the layer from a value of 0.07 to a value of 0.25, and n-doped with Si to approximately $5\times10^{17}/cm^3$ carrier concentration (e.g., grading may be in linear or parabolic fashion);

a 2000-Angstrom emitter layer of $Al_{0.25}Ga_{0.75}As$, n-doped with Si to approximately $5\times10^{17}/cm^3$ carrier concentration (other compositions of the form $Al_xGa_{1-x}As$, $0.2\leq x\leq 0.75$ also represent possible emitter layer materials, with carrier concentration preferably in a range from $5 \times 10^{16}$ to $10^{18}/cm^3$);

a 500-Angstrom $Al_xGa_{1-x}As$ graded layer, with x gradually changing across the thickness of the layer from the corresponding value in the emitter layer to a value of 0, and n+-doped with Si to approximately $3 \times 10^{18}/cm^3$ carrier concentration; and a 3000-Angstrom GaAs contact layer, doped n+ with Si to a carrier concentration of approximately $3 \times 10^{18}/cm^3$.

Barrier layers can also be made of $Al_xGa_{1-x}As$, where preferably, $0.3 \leq x \leq 1$. Also, barriers can be made in the form of a superlattice, e.g., by pulsed-beam molecular beam epitaxy as referred to above. The emitter may be degenerately or nondegenerately doped. Device operation typically is under conditions of base-emitter forward bias and base-collector reverse bias. Contact is to the base, and contact may also be made to the well in the intermediary region between emitter and base (designated "I" in FIG. 18).

EXAMPLE 3

Figures 21, 22, 23:
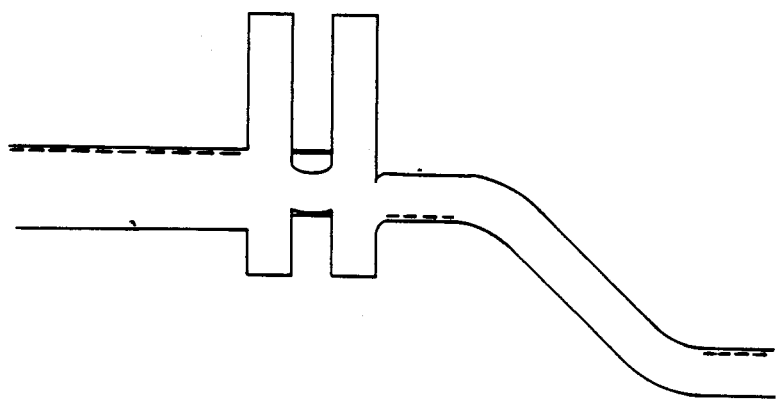
FIG. 21 is a graphical representation of the compositional make-up of a specific device of the invention in correspondence with FIG. 20.
FIG. 22 is an energy band diagram of a third device under operating conditions in which a quantum well is in a region between emitter and base regions.
FIG. 23 is a graphical representation of the compositional make-up of a specific device of the invention in correspondence with FIG. 22.

An embodiment of the invention in accordance with FIG. 20 and 21 can be viewed as obtained upon modification of the structure of Example 2 by greater thickness of the $Al_{0.07}Ga_{0.93}As$ offset layer and omission of the emitter graded layer. In the interest of prevention of quantization, thickness of the offset layer is preferably greater than approximately 500 Angstroms.

EXAMPLE 4

An embodiment of the invention in accordance with FIG. 22 and 23 can be viewed as obtained upon modification of the structure of Example 2 by omission of the emitter graded layer and choice of the emitter composition such that $E_1-\Delta E_C$ is at most a few kT.

TABLE 1

| $B_1$ | W | $B_2$ |
|---|---|---|
| p | p | p |
| u | u | u |
| u | p | u |
| u | p | p |
| u | n | u |
| n | n | u |
| n | u | n |
| n | n | n |
| n | p | p |

What is claimed is:

1. A heterostructure bipolar device comprising:
an emitter region having a first conductivity type and a first composition and bandgap profile;
a base region having a second conductivity type and a second composition and bandgap profile;
a collector region having said first conductivity type and having a third composition and bandgap profile;
first, second, and third electrical contracts to said emitter, base, and collector regions, respectively;
a quantum well between said collector region and said electrical contact to said emitter region, said quantum well being the only quantum well between said collector region and said electrical contact to said emitter region.
said device being capable of operating such that there are first and third base-emitter voltages and a second base-emitter voltage intermediary to said first and third base-emitter voltages such that, at said first, second, and third base-emitter voltages, the bottom of the conduction band in at least a portion of said emitter region is blow, at, and above, respectively, a quantum resonance of said quantum well, said portion being between said first electrical and said quantum well.

2. A device as recited in claim 1 in which, at said first and third base-emitter voltages, the bottom of the conduction band in at least a portion of said emitter region is below and above, respectively, a plurality of quantum resonances of said quantum well, said portion being between said first electrical contact and said quantum well.

3. A device as recited in claim 1 in which said quantum well is in said emitter region.

4. A device as recited in claim 1 in which said quantum well is between said emitter region and said collector region.

5. A device as recited in claim 4 in which said quantum well is in said base region.

6. A device as recited in claim 4, said device comprising a region intermediary to said emitter region and said base region, and said quantum well being in said intermediary region.

7. A device as recited in claim 1 in which said first conductivity type is n-type.

8. A device as recited in claim 1 in which said quantum well is a parabolic well.

9. A device as recited in claim 1 in which said collector region and said base region form a heterojunction which is such that the conduction band of the base region is below the conduction band of the collector region, and the valence band of the base region is above the valence band of the collector region.

10. A device as recited in claim 9 in which the edges of said quantum well are defined by two heterojunctions.

11. A circuit comprising a plurality of devices as recited in claim 1, and further comprising a resistive network connected to said second electrical contact, said network having a plurality of inputs.

12. A circuit comprising a plurality of devices as recited in claim 1, said devices being connected in parallel, further comprising a voltage scaling network, said network being connected to said second electrical contact.

13. A circuit comprising a device as recited in claim 1, further comprising means for maintaining said base-collector junction at fixed bias, and resistance connected to said third electrical contact.

14. A device as recited in claim 5, said device comprising means for tunneling injection of minority carriers into said quantum well, and said device having structure such that, for at least some operation condition, the conduction band of a portion of said base region adjoining said emitter region is essentially at the same level as the bottom of the ground-state subband of said quantum well.

15. A device as recited in claim 14, said portion of said base region not being electrically contacted.

16. A device as recited in claim 14, said conduction band lying below said bottom of the ground-state subband not by more than 5 kT.

17. A device as recited in claim 1, said quantum well being defined by potential barriers.

18. A device as recited in claim 17 in which said potential barriers are undoped.

19. A device as recited in claim 17 in which said quantum well is undoped.

20. A device as recited in claim 4, one side of said quantum well being defined by the heterojunction formed by said emitter region and said base region.

21. A heterostructure bipolar photodetector device comprising:
- an emitter region having a first conductivity type and a first composition and bandgap profile;
- a base region having a second conductivity type and a second composition and bandgap profile;
- a collector region having said first conductivity type and having a third composition and bandgap profile;
- first, second, and third electrical contacts to said emitter, base, and collector regions, respectively;
- a quantum well between said collector region and said electrical contact to said emitter region, said quantum well being the only quantum well between said collector region and said electrical contact to said emitter region, said device being capable of operating such that there are first and third base-emitter voltages and a second base-emitter voltage intermediary to said first and third base-emitter voltages such that, at said first, second, and third base-emitter voltages, the bottom of the conduction band in at least a portion of said emitter region is below, at, and above, respectively, a quantum resonance of said quantum well, said portion being between said first electrical contact and said quantum well.

* * * * *